(12) United States Patent
Park et al.

(10) Patent No.: US 6,780,743 B2
(45) Date of Patent: Aug. 24, 2004

(54) METHOD OF FORMING A FLOATING GATE IN A FLASH MEMORY DEVICE

(75) Inventors: Sang Wook Park, Seoul (KR); Seung Cheol Lee, Ichon-Shi (KR); Jung Il Cho, Yongin-Shil (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/631,200

(22) Filed: Jul. 31, 2003

(65) Prior Publication Data

US 2004/0115885 A1 Jun. 17, 2004

(30) Foreign Application Priority Data

Dec. 12, 2002 (KR) ........................................ 2002-79204

(51) Int. Cl.[7] ........................................ H01L 21/8247
(52) U.S. Cl. ........................ 438/594; 438/264; 438/296
(58) Field of Search ................................ 438/257–267, 438/593–594, 296

(56) References Cited

U.S. PATENT DOCUMENTS

| | | | | | |
|---|---|---|---|---|---|
| 5,010,028 A | * | 4/1991 | Gill et al. | ................. | 438/263 |
| 5,597,749 A | * | 1/1997 | Iguchi | ................. | 438/265 |
| 5,604,141 A | * | 2/1997 | Bergemont | ................. | 438/261 |

\* cited by examiner

*Primary Examiner*—Richard A. Booth
(74) *Attorney, Agent, or Firm*—Marshall, Gerstein & Borun LLP

(57) ABSTRACT

Disclosed is a method of forming a floating gate in a date flash memory device on which first and second polysilicon films are stacked. After the first polysilicon film is formed, a $SiH_4$ gas is introduced to decompose $SiH_4$ and $SiO_2$ into Si and $H_2$ and Si and $O_2$. A $N_2$ anneal process is then implemented so that the decomposed $H_2$ gas and $O_2$ gas react to a $N_2$ gas and are then outgassed. Next, a $SiH_4$ gas and a $PH_3$ gas are introduced to form the second polysilicon film. A native oxide film within the interface of the first polysilicon film and the second polysilicon film is removed to improve characteristics of the data flash memory device.

5 Claims, 4 Drawing Sheets

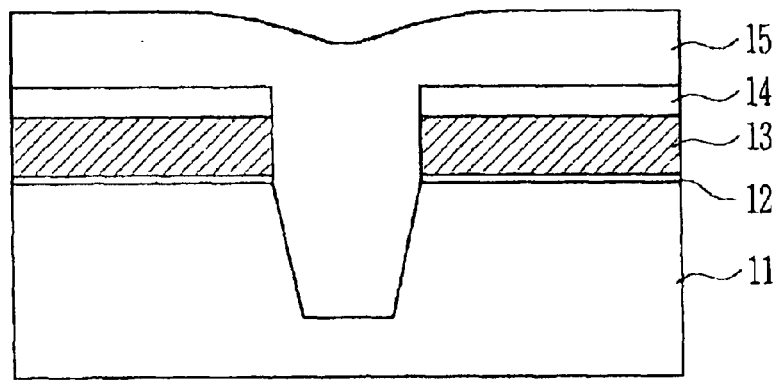
FIG. 1A (PRIOR ART)
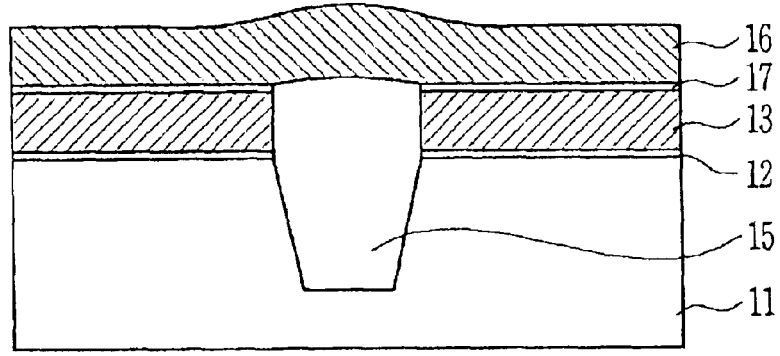
FIG. 1B (PRIOR ART)
FIG. 2 (PRIOR ART)
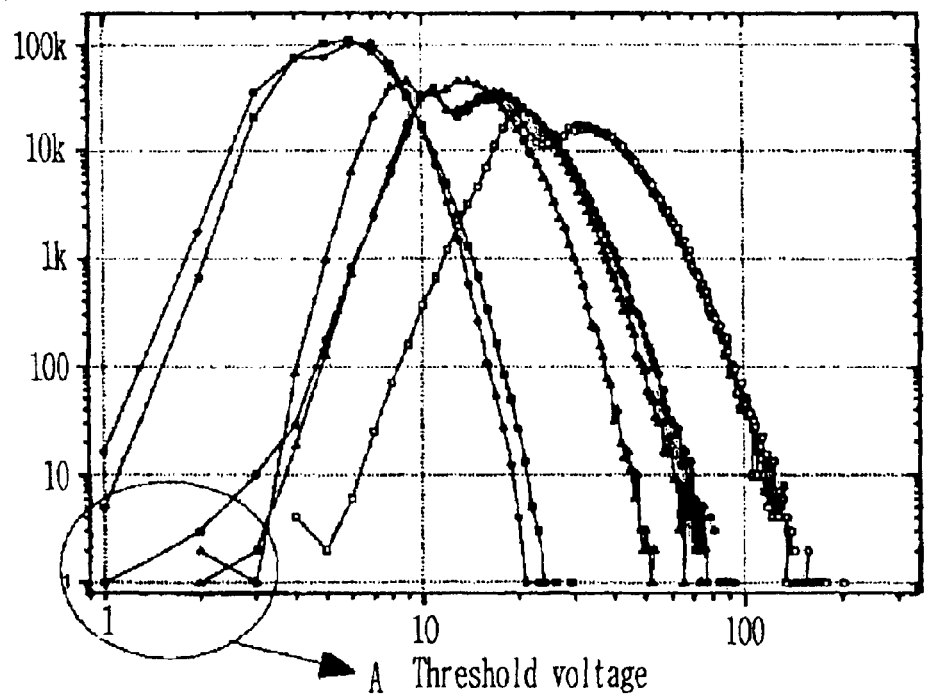

METHOD OF FORMING A FLOATING GATE IN A FLASH MEMORY DEVICE

BACKGROUND OF THE INVENTION

1. Field of the Invention

The present invention relates to a method of forming a floating gate in a flash memory device, and more particularly, to a method of forming a floating gate in a flash memory device capable of improving a characteristic of a data flash memory device by removing a native oxide film within the interface of a first polysilicon film and a second polysilicon film, in such a manner that after the first polysilicon film is formed, a $SiH_4$ gas is introduced to decompose the native oxide film, a $N_2$ anneal process is implemented so that the decomposed a $H_2$ gas and an $O_2$ gas react to a $N_2$ gas and are then outgassed, and a $SiH_4$ gas and a $PH_3$ gas are introduced to form the second polysilicon film.

2. Background of the Related Art

A floating gate of a data flash memory device of 0.115 μm consists of a dual polysilicon film of first and second polysilicon films. This plays an important role that electrons are moved by a mechanism such program, erase, etc. However, since the first and second polysilicon films are formed by an ex-situ process, a native oxide film is formed at the interface of the first polysilicon film and the second polysilicon film.

A method of forming the floating gate in the data flash memory device of 0.115 μm that has been currently developed will be described by reference to FIG. 1A and FIG. 1B.

Referring to FIG. 1A, a tunnel oxide film 12 and a first polysilicon film 13 are formed on a semiconductor substrate 11. A nitride film 14 is then formed on the first polysilicon film 13. Next, the nitride film 14 is patterned by a lithography process and an etch process using an isolation mask. The first polysilicon film 13 and the tunnel oxide film 12 are etched using the patterned nitride film 14 as a mask. Thereafter, the exposed semiconductor substrate 11 is etched by a given depth, thus forming a trench. An oxide film 15 is then formed on the entire structure so that the trench is buried.

By reference to FIG. 1B, after the oxide film 15 is polished, the nitride film 14 on the first polysilicon film 13 is etched to form an isolation film. A second polysilicon film 16 is then formed on the entire structure. Next, the second polysilicon film 16 and the first polysilicon film 13 are patterned to form a floating gate. As the first polysilicon film 13 and the second polysilicon film 16 are not formed by a consecutive process, however, the native oxide film 17 exists at the interface of the first polysilicon film 13 and the second polysilicon film 16.

As the floating gate is formed by the above process, the native oxide film exists at the interface of the first polysilicon film and the second polysilicon film. Due to this, there is a problem that electrons are trapped to the native oxide film when the device operates. Bit fail occurs in which the threshold voltage of the cell drops due to the electrons trapped to the native oxide film. Furthermore, as the native oxide film serves as a parasitic capacitor, there occurs a phenomenon that the initially applied voltage is dropped. This degrades the overall uniformity in distributing the threshold voltage of the cell being an important parameter of the flash memory device, which results in degrading characteristics of the device.

Meanwhile, if the process time until the second polysilicon film is formed after the surface of the first polysilicon film is cleaned is delayed, the thickness of the native oxide film is further increased. The reason why the native oxide film is grown even after the surface of the first polysilicon film is cleaned is that it is difficult to complete remove a chemical oxide film since a small amount of the chemical oxide film remains due to chemical material even after the cleaning process is implemented.

FIG. 2 is a graph illustrating relationship of the threshold voltage of the cell and number of the cell in an erase operation. In FIG. 2, cells at a portion indicated by "A" represent ones the threshold voltage of which is dropped. This is called "bit fail tail".

FIG. 3 illustrates observation results on a SIMS profile in order to confirm a phosphorous doping profile depending on whether the surface of the first polysilicon film is cleaned. In FIG. 3, "A" represents a wafer on which an amorphous silicon film which not given a thermal budget is deposited. This represents that the phosphorous concentration within the second polysilicon film bulk is about 3.2E20 atoms/cc and phosphorous is not yet diffused into the first polysilicon film. "B" represents that the surface of the first polysilicon film is cleaned. In case where the native oxide film at the interface of the first and second polysilicon films is grown in thickness of about 18 Å, "B" represents that the concentration of phosphorous within the first polysilicon film and the concentration of phosphorous within the second polysilicon film are almost same. "C" represents that the surface of the first polysilicon film is not cleaned. Since the native oxide film of over 30 Å is grown at the interface of the first polysilicon film and the second polysilicon film, the concentration of phosphorous within the first polysilicon film is about 5.6E19 atoms/cc and the concentration of phosphorous within the second polysilicon film is not more than 1.1E20 atoms/cc that is a half of the concentration of phosphorous within the first polysilicon film. As described above, as the thickness of the native oxide film is increased at the interface of the first polysilicon film and the second polysilicon film, there is a significant difference in the phosphorous doping profile.

SUMMARY OF THE INVENTION

Accordingly, the present invention is contrived to substantially obviate one or more problems due to limitations and disadvantages of the related art.

An object of the present invention is to provide a method of forming a floating gate in a flash memory device capable of completely removing a native oxide film grown between a first polysilicon film and a second polysilicon film and thus improving the operational reliability of the device.

Another object of the present invention is to provide a method of forming a floating gate in a flash memory device capable of completely removing a native oxide film within the interface of a first polysilicon film and a second polysilicon film, in such a manner that after the first polysilicon film is formed, a $SiH_4$ gas is introduced to decompose the native oxide film, a $N_2$ anneal process is implemented so that a $H_2$ gas and an $O_2$ gas of the decomposed native oxide film react to a $N_2$ gas and are then outgassed, and the second polysilicon film is then formed.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming a floating gate in a flash memory device according to the present invention is characterized in that it comprises the steps of forming a tunnel oxide film and a first polysilicon film on a semiconductor substrate, etching given regions of the first polysilicon film and the tunnel oxide film and then etching the exposed semiconductor substrate by a given depth, thus forming a trench, forming an oxide film on the entire structure so that the trench is buried, and then polishing the oxide film to form an isolation film, decomposing a native oxide film grown on the first polysilicon film, implementing an anneal process to outgas the decomposed material, and then forming a second polysilicon film, and patterning the second polysilicon film and the first polysilicon film to form a floating gate.

In another aspect of the present invention, it is to be understood that both the foregoing general description and following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 1A and FIG. 1B are cross-sectional views of data flash memory devices for explaining a conventional method of forming a floating gate in the memory device;

FIG. 2 is a graph illustrating relationship of the threshold voltage of the cell and number of the cell in an erase operation;

DETAILED DESCRIPTION OF THE PREFERRED EMBODIMENT

Figure 3:
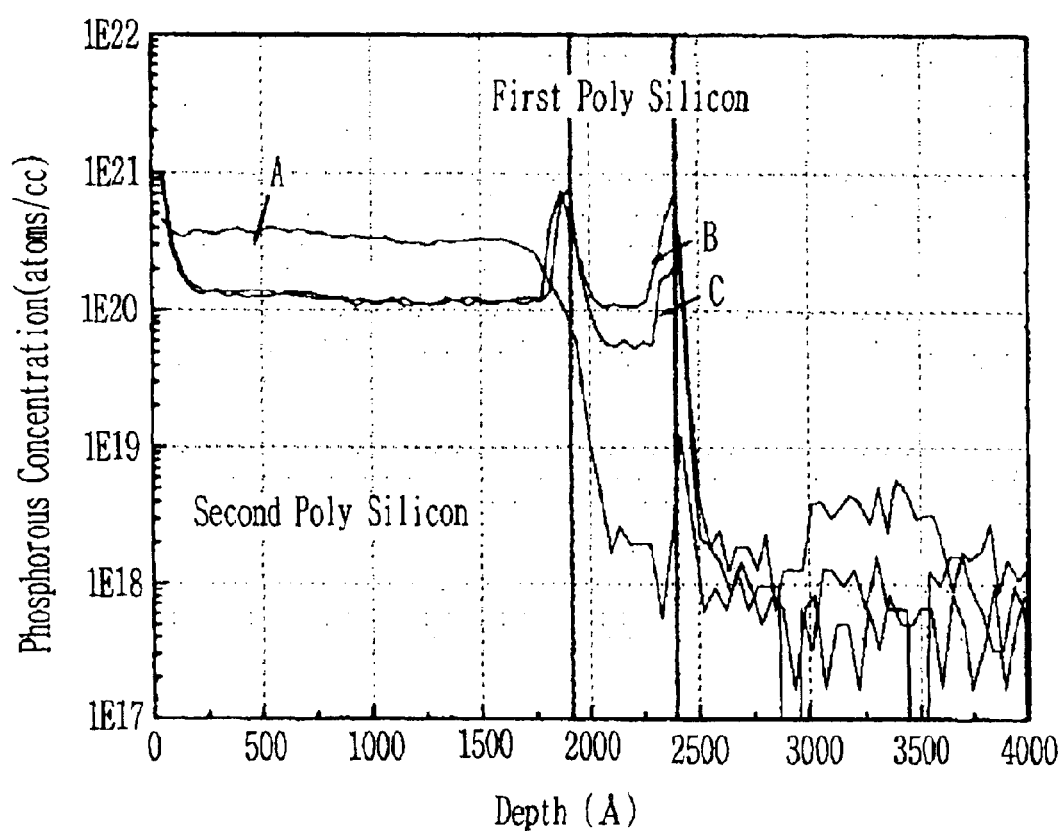
FIG. 3 is a graph illustrating a phosphorous doping profile depending on whether the surface of the first polysilicon film is cleaned.

Reference will now be made in detail to the preferred embodiments of the present invention, examples of which are illustrated in the accompanying drawings, in which like reference numerals are used to identify the same or similar parts.

Figure 4A:
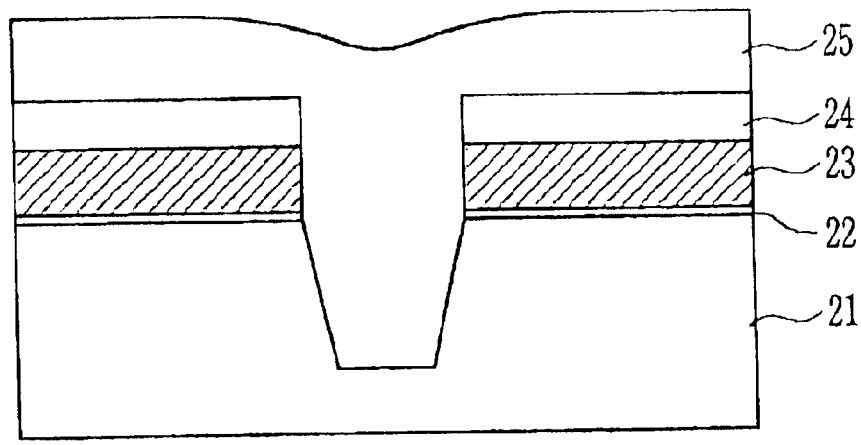
FIG. 4A~FIG. 4C are cross-sectional views of flash memory devices for explaining a method of forming a floating gate in the memory device according to a preferred embodiment of the present invention.
Figure 4B:
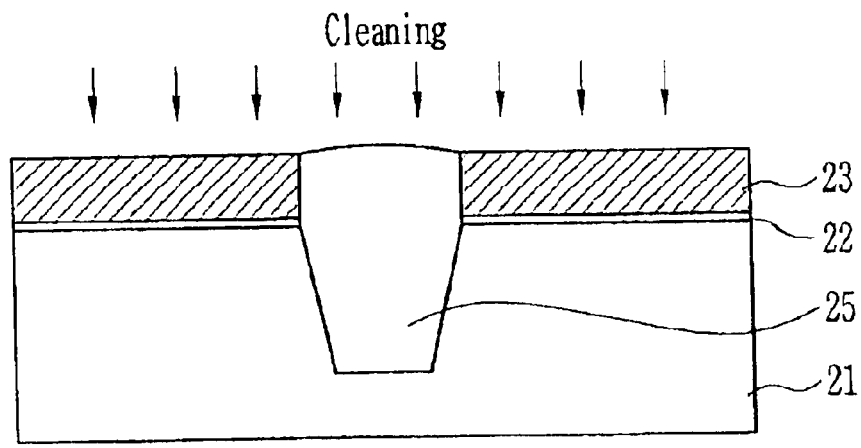
Figure 4C:
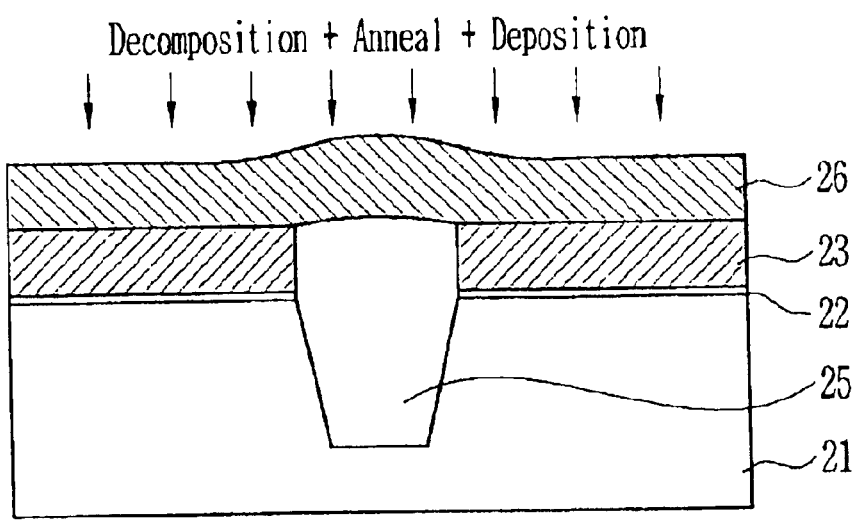

FIG. 4A~FIG. 4C are cross-sectional views of flash memory devices for explaining a method of forming a floating gate in the memory device according to a preferred embodiment of the present invention. FIG. 6 illustrates a process recipe for forming a second polysilicon film according to the present invention.

The method of forming the floating gate in the flash memory device will be now described by reference to FIG. 5 and FIG. 6.

Referring to FIG. 4A, a tunnel oxide film 22 and a first polysilicon film 23 are formed on a semiconductor substrate 21. A nitride film 24 is formed on the first polysilicon film 23. At this time, the first polysilicon film 23 is formed in thickness of about 300~700 Å. Next, the nitride film 24 is patterned by means of a lithography process and an etch process using an isolation mask. After the first polysilicon film 23 and the tunnel oxide film 22 are etched using the patterned nitride film 24 as a mask, the exposed semiconductor substrate 21 is etched by a given depth, thereby forming a trench. An oxide film 25 is then formed on the entire structure so that the trench is buried.

By reference to FIG. 4B, after the oxide film 25 is polished, the nitride film 24 on the first polysilicon film 23 is etched to form an isolation film. Also, a cleaning process is implemented to minimize the native oxide film grown on the surface of the first polysilicon film 23. At this time, the native oxide film is not completed removed by the cleaning process and a chemical oxide film remains. The cleaning process is implemented using a HF solution, a diluted HF solution or RCA. Meanwhile, if the cleaning process is implemented using the HF solution, a hydrophobic surface may be formed while minimizing the growth of the chemical oxide film. If the cleaning process is implemented using RCA, generation of defects and particles could be minimized.

Figure 5:
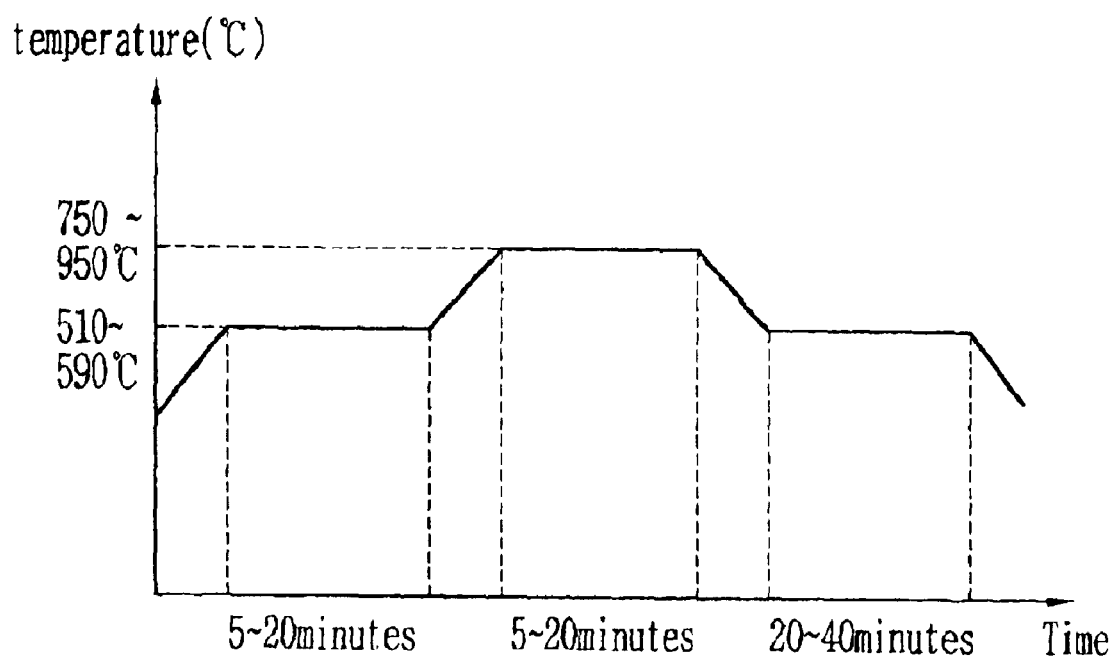
FIG. 5 illustrates a process recipe for forming a second polysilicon film according to the present invention.

Turning to FIG. 4C and FIG. 5, in a state that the temperature and pressure of the reaction chamber are kept at 510~590° C. and 200~600 mTorr, respectively, depending on the process recipe shown in FIG. 5, a $SiH_4$ gas of about 0.1~1.9 SLM is introduced and reacts for about 5~20 minutes so that $SiH_4$ and $SiO_2$ are decomposed according to [Chemical Equation 1]. In a state that the temperature and pressure of the reaction chamber are kept at 750~950° C. and 100~300 mTorr, respectively, a $N_2$ gas of about 0.1~1.9 SLM is introduced and reacts for 5~20 minutes so that a $H_2$ gas and an $O_2$ gas react to a $N_2$ gas and are then outgassed according to [Chemical Equation 2]. Furthermore, in a state that the temperature and pressure of the reaction chamber are kept at 510~590° C. and 200~600 mTorr, a mixed gate of $SiH_4$ and $PH_3$ of 0.5~2.0 SLM are introduced and reacts for 20~40 minutes to form the second polysilicon film 26. The silicon film is regrown in thickness of 10~30 Å on the first polysilicon film 23 by decomposition using the $SiH_4$ gas and outgassing using $N_2$ anneal. A total thickness of the second polysilicon film 26 becomes about 60~2000 Å by the mixed gas of the $SiH_4$ gas and the $PH_3$ gas. Furthermore, the second polysilicon film 26 and first polysilicon film 23 are patterned to form a floating gate.

$$SiH_4 \rightarrow Si^* + 2H_2$$

$$SiO_2 \rightarrow Si^* + O \qquad \text{[Chemical Equation 1]}$$

$$N_2 \rightarrow N^* + N^*$$

$$N^* + 2H_2 \rightarrow NH_3 \text{ (outgassing)}$$

$$N^* + O \rightarrow NO \text{ (outgassing)} \qquad \text{[Chemical Equation 2]}$$

As described above, according to the present invention, after the first polysilicon film is formed, the $SiH_4$ gas is introduced to decompose $SiH_4$ and $SiO_2$ into Si and $H_2$ and Si and $O_2$, respectively, a $N_2$ anneal process is implemented so that the decomposed $H_2$ gas and $O_2$ gas react to the $N_2$ gas and are then outgassed, and the $SiH_4$ gas and the $PH_3$ gas are introduced to form a second polysilicon film. Therefore, the present invention has new effects that it can improve characteristics of a data flash memory device by removing the native oxide film within the interface of the first polysilicon film and the second polysilicon film.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of forming a floating gate in a flash memory device, comprising the steps of:

forming a tunnel oxide film and a first polysilicon film on a semiconductor substrate;

etching given regions of the first polysilicon film and the tunnel oxide film and then etching the exposed semiconductor substrate by a given depth, thus forming a trench;

forming an oxide film on the entire structure so that the trench is buried, and then polishing the oxide film to form an isolation film;

decomposing a native oxide film grown on the first polysilicon film, implementing an anneal process to outgas the decomposed material, and then forming a second polysilicon film; and patterning the second polysilicon film and the first polysilicon film to form a floating gate.

2. The method as claimed in claim 1, further comprising the step of cleaning the surface of the first polysilicon film using a HF solution, a diluted HF solution or RCA after the isolation film is formed.

3. The method as claimed in claim 1, wherein decomposition of the native oxide film is to decompose $SiH_4$ and $SiO_2$ into Si and $H_2$ and Si and $O_2$ by introducing a $SiH_4$ gas of about 0.1~1.9 SLM and reacting it for about 5~20 minutes, in a state that the temperature and pressure of a reaction chamber are kept at 510~590° C. and 200~600 mTorr, respectively.

4. The method as claimed in claim 1, wherein the anneal process is implemented by introducing a $N_2$ gas of about 0.1~1.9 SLM and reacting it for 5~20 minutes so that a $H_2$ gas and an $O_2$ gas react to a $N_2$ gas and are then outgassed, in a state that the temperature and pressure of a reaction chamber are kept at 750~950° C. and 100~300 mTorr, respectively.

5. The method as claimed in claim 1, wherein the second polysilicon film is formed by introducing a mixed gas of a $SiH_4$ gas and a $PH_3$ gas of about 0.5~2.0 SLM and then reacting it for 20~40 minutes, in a state that the temperature and pressure of a reaction chamber are kept at 510~590° C. and 200~600 mTorr, respectively.

* * * * *

UNITED STATES PATENT AND TRADEMARK OFFICE
CERTIFICATE OF CORRECTION

| | |
|---|---|
| PATENT NO. | : 6,780,743 B2 |
| APPLICATION NO. | : 10/631200 |
| DATED | : August 24, 2004 |
| INVENTOR(S) | : Park et al. |

It is certified that error appears in the above-identified patent and that said Letters Patent is hereby corrected as shown below:

**Title Page
Column 1
Field (75): Inventors**

After "Seung Cheol Lee," please delete "Ichon-Shi"
        and insert -- Kyungki-Do -- in its place.

**Title Page
Column 1
Field (75): Inventors**

After "Jung Il Cho," please delete "Yongin-Shil"
        and insert -- Kyungki-Do -- in its place.

Signed and Sealed this

Twenty-ninth Day of May, 2007

JON W. DUDAS
*Director of the United States Patent and Trademark Office*